(12) United States Patent
Urban et al.

(10) Patent No.: US 9,525,088 B2
(45) Date of Patent: Dec. 20, 2016

(54) FASTENING OF A SUPPORT RAIL FOR A PV MODULE TO A TRAPEZOIDAL SHEET

(75) Inventors: Hans Urban, Haag (DE); Dieter Fluhrer, Reichertsheim (DE)

(73) Assignee: SCHLETTER GMBH, Kirchdorf (DE)

( * ) Notice: Subject to any disclaimer, the term of this patent is extended or adjusted under 35 U.S.C. 154(b) by 728 days.

(21) Appl. No.: 13/700,135

(22) PCT Filed: May 19, 2011

(86) PCT No.: PCT/DE2011/001084
§ 371 (c)(1),
(2), (4) Date: Feb. 27, 2013

(87) PCT Pub. No.: WO2011/147404
PCT Pub. Date: Dec. 1, 2011

(65) Prior Publication Data
US 2013/0145606 A1    Jun. 13, 2013

(30) Foreign Application Priority Data

May 27, 2010  (DE) .......................... 10 2010 021 713

(51) Int. Cl.
*H01L 31/04*     (2014.01)
*H01L 31/042*    (2014.01)
(Continued)

(52) U.S. Cl.
CPC .......... *H01L 31/0424* (2013.01); *F24J 2/5203* (2013.01); *F24J 2/5249* (2013.01);
(Continued)

(58) Field of Classification Search
CPC ................... Y10T 403/7062; Y10T 403/7094;
F24J 2/5203; F24J 2/5249; F24J 2002/5215; F24J 2002/5226; H02S 30/10; H02S 30/00
See application file for complete search history.

(56) References Cited

U.S. PATENT DOCUMENTS 7,237,368 B2 *  7/2007  Richardson ........... E04B 1/4107
                                                  52/295
7,814,710 B2 * 10/2010  Foglia .................. E04B 1/4107
                                                  52/709
(Continued)

FOREIGN PATENT DOCUMENTS

AU   WO 2014032122 A1 *  3/2014  ............... E04D 3/30
DE   20 2005 003 717 U1    6/2005
(Continued)

*Primary Examiner* — Daniel P Stodola
*Assistant Examiner* — Jonathan Masinick
(74) *Attorney, Agent, or Firm* — Norman B. Thot

(57) ABSTRACT

A fastening of a support rail for a photovoltaic module to a trapezoidal rib of a trapezoidal sheet. The support rail comprises an undercut groove with a groove opening. The trapezoidal rib comprises an upper side and a slanted side. The support rail is positioned transversely to the trapezoidal rib. The fastening includes at least one retaining element comprising a fastening section fastened to the slanted side of the trapezoidal rib, and an engaging extension non-detachably arranged thereon. The engaging extension engages the undercut groove in an engaging position. The engaging extension is insertable through the groove opening into the undercut groove of the support rail in a loose position that is rotated relative to the engaging position. The support rail is held down against the upper side of the trapezoidal rib by the engaging extension. The at least one retaining element is arranged either left or right of the trapezoidal rib.

15 Claims, 7 Drawing Sheets

(51) Int. Cl.
*F24J 2/52* (2006.01)
*H02S 30/10* (2014.01)

(52) U.S. Cl.
CPC .............. *H02S 20/00* (2013.01); *H02S 30/10* (2014.12); *F24J 2002/5215* (2013.01); *F24J 2002/5226* (2013.01); *Y02B 10/12* (2013.01); *Y02E 10/47* (2013.01); *Y02E 10/50* (2013.01); *Y10T 29/49963* (2015.01); *Y10T 403/7062* (2015.01)

(56) References Cited

U.S. PATENT DOCUMENTS

| | | | |
|---|---|---|---|
| 7,877,948 B2 * | 2/2011 | Davies | B60R 13/01 411/354 |
| 2008/0310913 A1 | 12/2008 | Urban et al. | |
| 2011/0271611 A1 * | 11/2011 | Maracci | F24J 2/5245 52/173.3 |
| 2015/0144580 A1 * | 5/2015 | Kitano | F24J 2/5207 211/41.17 |

FOREIGN PATENT DOCUMENTS

| | | | | |
|---|---|---|---|---|
| DE | 20 2008 007 838 U1 | 9/2008 | | |
| DE | 10 2007 018 212 A1 | 10/2008 | | |
| DE | 10 2008 028 108 A1 | 2/2009 | | |
| DE | 20 2009 003 124 U1 | 5/2009 | | |
| DE | 20 2009 002 208 U1 | 7/2009 | | |
| DE | 20 2009 010 984 U1 | 12/2009 | | |
| DE | 20 2010 001 238 U1 | 4/2010 | | |
| DE | 202010007234 U1 * | 10/2011 | ............. | F24J 2/5228 |
| DE | 202011108518 U1 * | 3/2013 | ............. | F24J 2/5249 |
| JP | 5039892 Y2 * | 10/1993 | | |
| JP | 5039892 B2 * | 10/2012 | ............. | F24J 2/5249 |
| WO | WO 99/10609 A1 | 3/1999 | | |
| WO | WO 2009/020177 A1 | 2/2009 | | |

* cited by examiner

FASTENING OF A SUPPORT RAIL FOR A PV MODULE TO A TRAPEZOIDAL SHEET

CROSS REFERENCE TO PRIOR APPLICATIONS

This application is a U.S. National Phase application under 35 U.S.C. §371 of International Application No. PCT/DE2011/001084, filed on May 19, 2011 and which claims benefit to German Patent Application No. 10 2010 021 713.1, filed on May 27, 2010. The International Application was published in German on Dec. 1, 2011 as WO 2011/147404 A2 under PCT Article 21(2).

FIELD

The present invention relates to a fastening of a support rail for a photovoltaic module to a trapezoidal rib of a trapezoidal sheet.

BACKGROUND

An inclined arrangement of PV modules on a trapezoidal sheet is described in DE 20 2008 007 838 U1. The inclined arrangement comprises a plurality of retaining elements for central fitting onto the ribs of the trapezoidal sheet as well as two PV module support rails positioned transversely to the ribs. The retaining elements encompass the ribs on three sides and are fastened to both slanted sides of the ribs. The support rails rest on the retaining elements and are to be screwed thereto in a labour-intensive manner. The retaining elements are additionally manufactured individually for differently shaped ribs.

A similar inclined arrangement is described in DE 20 2009 002 208 U1, including holders that are described in more detail in DE 10 2008 028 108 A1 and that are provided, as above, for central fitting onto the ribs of a trapezoidal sheet. The holders carry threaded bolts welded thereon for multi-part clamping devices, in which the support rails are in turn received. A screw-driving tool is required to actuate the clamping devices. These holders must also be manufactured individually for different rib shapes.

SUMMARY

An aspect of the present invention is to provide a material-efficient, production-oriented and assembly-friendly fastening of a support rail for a PV module to a rib of a trapezoidal sheet.

In an embodiment, the present invention provides a fastening of a support rail for a photovoltaic module to a trapezoidal rib of a trapezoidal sheet. The support rail comprises an undercut groove with a groove opening. The trapezoidal rib comprises an upper side and a slanted side. The support rail is configured to be positioned transversely to the trapezoidal rib. The fastening includes at least one retaining element comprising a fastening section configured to be fastened to the slanted side of the trapezoidal rib, and an engaging extension non-detachably arranged on the fastening section. The engaging extension is configured to engage the undercut groove in an engaging position. The engaging extension is configured to be insertable through the groove opening into the undercut groove of the support rail in a loose position that is rotated relative to the engaging position. The support rail is configured to be held down against the upper side of the trapezoidal rib by the engaging extension. The at least one retaining element is arranged either to a left or to a right of the trapezoidal rib.

BRIEF DESCRIPTION OF THE DRAWINGS

The present invention is described in greater detail below on the basis of embodiments and of the drawings in which.

DETAILED DESCRIPTION

Figure 1:
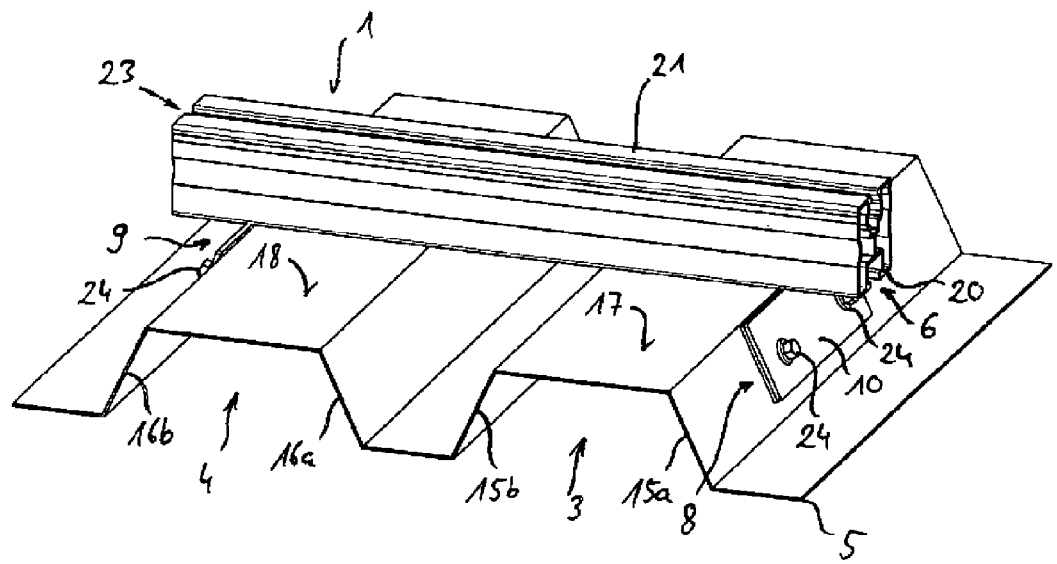
FIG. 1 shows a fastening of a support rail for a PV module to a trapezoidal rib of a trapezoidal sheet.
Figure 2:
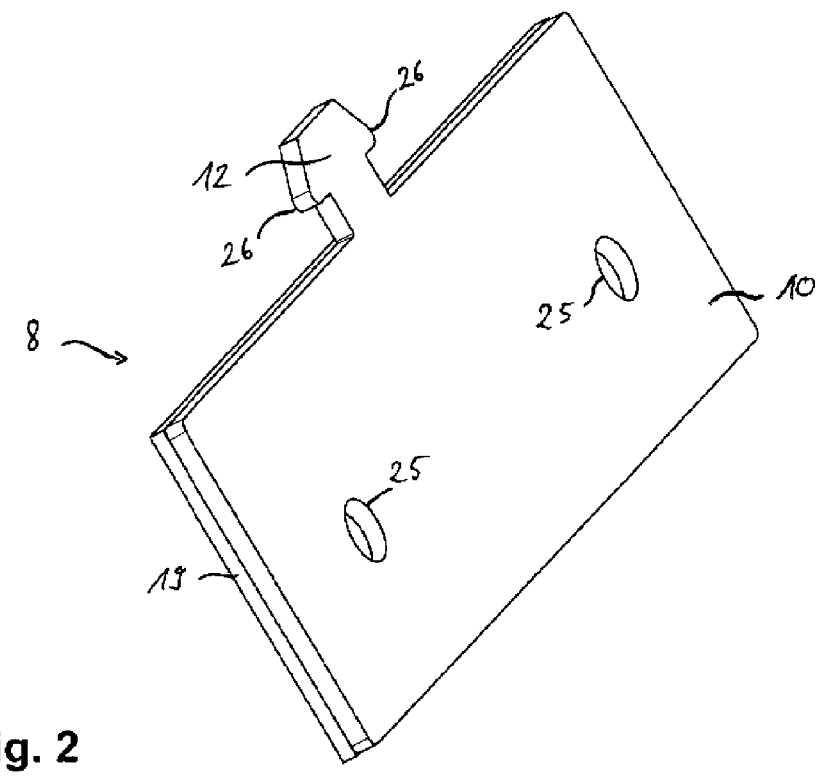
FIG. 2 shows, separately, a retaining element of the fastening according to FIG. 1.

The connection between the retaining element and the support rail is screw-free and can be generated quickly, easily, securely and in a stable manner by means of the engaging extension. It is possible to insert the retaining element at any point along the groove opening into the groove in an assembly-friendly manner. Even if a support rail has already been arranged on several of ribs, the retaining element can still be assembled subsequently on any free slanted side of these ribs. It is also advantageous that the support rail can rest on the upper side of the rib, either directly (which is structurally expedient) or just separated by a thin elastic protection layer. The retaining element is additionally particularly material-saving and can be provided in a geometrically simple manner, as it is arranged either only to the left or only to the right. It does not contact the upper side of the rib. The retaining element is suitable for different rib shapes without any need of adjustment.

In an embodiment of the present invention, the groove can, for example, be undercut on both sides. The retaining element can thus engage the groove from both sides by means of the engaging extension, for which purpose it is expedient if the engaging extension has two protrusions in opposing outward directions. The engaging extension thus cooperates with the groove in the manner of a hammer head or T-shaped bolt so that the connection between the retaining element and the support rail is particularly stable.

For the transfer of particularly large loads parallel to the support rail, it may be expedient if the engaging extension has a pin or even if the engaging extension itself has an extension which engages in a recess in the groove base of the groove. The support rail is thus additionally fixed in its longitudinal direction on the retaining element. The recess may be a simple drilled hole in the groove base.

In an embodiment of the present invention particularly oriented to production, the engaging extension and the fastening section are connected to each other integrally and/or are manufactured from exactly one piece of sheet metal or plastic. Punching or laser cutting are, for example, suitable production methods.

Particularly in combination with the aforementioned embodiment, it may also be of further advantage if the engaging extension and the fastening section are formed in a coplanar manner, in particular, as a plane-parallel plate. A retaining element of this type can be produced in a particularly simple manner. It is alternatively conceivable for the engaging extension to be formed at an angle to the fastening section in such a way that the engaging extension is steeper with respect to the upper side of the rib than a virtual straight extension of the slanted side of the rib. This means that an angle between the engaging extension and the upper side of the rib is closer to a right angle than an angle between the virtual straight extension of the slanted side and the upper side of the rib. This can increase the strength of the connection between the retaining element and the support rail and can facilitate the insertion of the engaging extension into the groove, in particular, if the support rail has already been arranged on the upper side and the rib is relatively low. For maximum strength, the engaging extension can, for example, be oriented perpendicular or substantially perpendicular to the upper side of the rib.

The fastening section can be fastened in a known manner by means of screws or rivets to the slanted side of the rib. In order to prevent prior introduction of holes into the slanted side, self-cutting screws can be used for this purpose. By contrast, previously introduced through-openings may be advantageous in the fastening section.

In a particularly assembly-friendly embodiment of the present invention, the fastening section protrudes along the rib on both sides beside the support rail. The fastening element is therefore accessible from the left and right of the support rail, as viewed in a perpendicular view onto the trapezoidal sheet. An assembler can thus ergonomically apply any fastening means, in particular, the aforementioned screws or rivets, on the fastening section by means of a tool, for example, a screwdriver or an electrical screw-driving device.

In an embodiment of the present invention, an elastic and/or plastic spacer is arranged between the fastening section and the slanted side of the rib and can, for example, be compressed in the final assembled position. Due to the elastic and/or plastic or ductile characteristics of the spacer, the spacing dimension thereof can advantageously be reduced by means of fastening the fastening section. The spacer may therefore consist of a rubber-like material, in particular of an EPDM material or a comparable elastomer having a Shore hardness, for example, of between 50 and 80. Such a spacer may be fastened to the fastening section in a prefabricated manner, so that it does not have to be arranged by an assembler. It can, for example, be fastened by means of adhesive or alternatively by means of retaining nubs which are impressed into openings in the fastening section. The spacer may be provided as a substantially one-part layer or may also consist of a plurality of local parts. In particular in combination with a fastening of the fastening section by means of screws or rivets, it may be advantageous if the spacer is also a sealing means which prevents the infiltration of rainwater through openings in the slanted side of the rib.

During the fastening of the fastening section to the slanted side of the rib, the elastic and/or spacer can be compressed, whereby the retaining element moves closer to the slanted side and simultaneously undergoes a small movement component in a downward direction due to its inclination. In this context, "downward" means in a downward direction that is perpendicular to the upper side of the rib. In this case, it is particularly advantageous that the retaining element tightens the support rail increasingly against the upper side by means of the engaging extension, so that a particularly stable, secure and durable connection is created. In a conceivable alternative, any screws or rivets can be deliberately applied not perpendicular to the slanted side, but slightly steeper, so that they will be directed perpendicularly when tensioned and the fastening section thus undergoes an additional small movement component in a downward direction.

The trapezoidal sheet will in practice have further trapezoidal ribs and the support rail will cross a plurality of these ribs. For further fastening of the support rail, it is expedient in this case if at least one further retaining element as previously described is provided, with which the support rail is held down against the upper side of at least one of the further ribs.

In an embodiment of the present invention that is particularly material-efficient in terms of the support rail, the support rail crosses merely three or two of the ribs. In addition, merely one further retaining element is provided with which the support rail is held down against the upper side of exactly one further rib of the three or two ribs. In this case, it is structurally advantageous if the retaining elements are fastened to the two outer slanted sides of the three or two ribs. Such a fastening in which the support rail crosses merely three or two ribs is particularly suitable as a fastening basis for the edge of a PV module or the adjacent edges of two PV modules arranged side by side.

In an embodiment of the present invention, the support rail can, for example, contain a second undercut groove for the fixation of a PV module. This second groove may be provided, in particular, in the upper side of the support rail.

The present invention also concerns the retaining element separately, should it be intended for an aforementioned fastening. This is also true for a kit comprising a support rail and at least two retaining elements as described above.

The present invention lastly also relates to a multi-arrangement in which one further fastening is provided or in which three further fastenings are provided, wherein a PV module is attached to the support rails of the fastenings. The support rails of a twin arrangement may carry a plurality of PV modules in a row. The support rails of a quadruple arrangement can, for example, be arranged in a rectangular pattern, wherein it is advantageous if adjacent PV modules are attached via their edges on two of the support rails simultaneously. The support rails can thus be provided in a particularly short manner and may further each end below the PV module.

The present invention will be explained in more detail hereinafter with respect to a plurality of exemplary embodiments.

Figure 3:
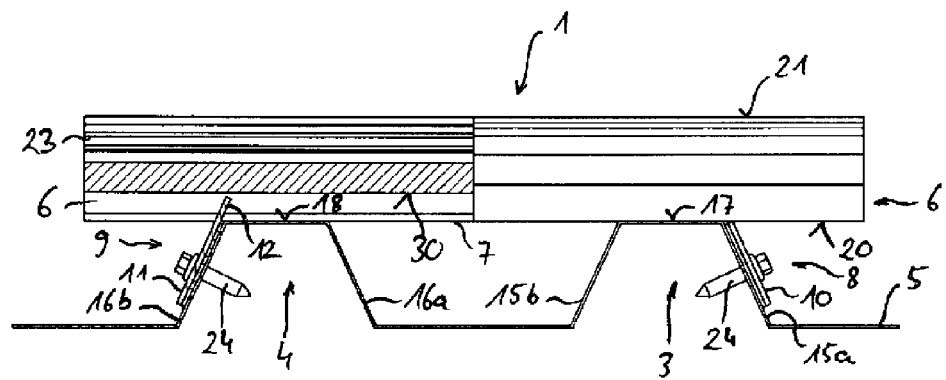
FIG. 3 shows a half section of the fastening according to FIG. 1 from the front (section AA in FIG. 4)
Figure 4:
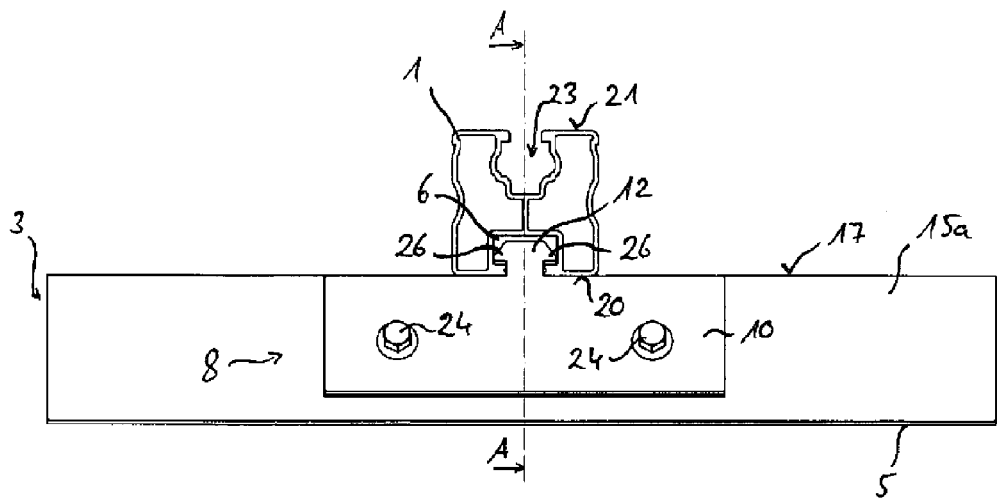
FIG. 4 shows a side view of the fastening according to FIG. 1 from the left.
Figure 5A:
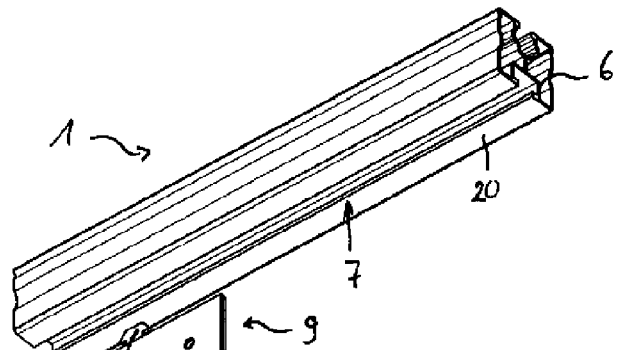
FIG. 5A shows a first step of joining the support rail to a retaining element according to FIG. 1.
Figure 5B:
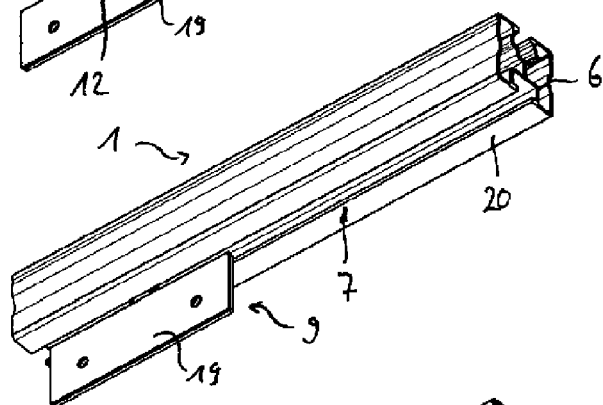
FIG. 5B shows a second step of joining the support rail to a retaining element according to FIG. 1.
Figure 5C:
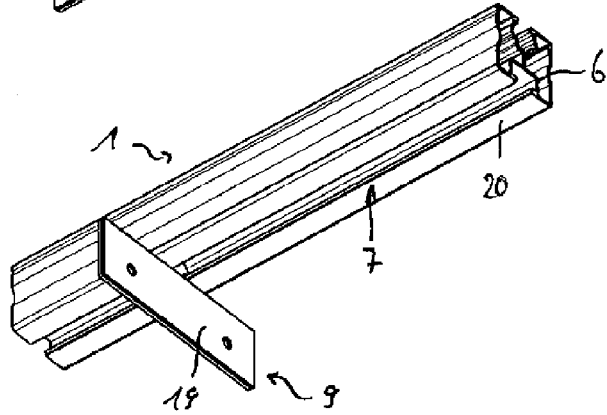
FIG. 5C shows a third step of joining the support rail to a retaining element according to FIG. 1.
Figure 5D:
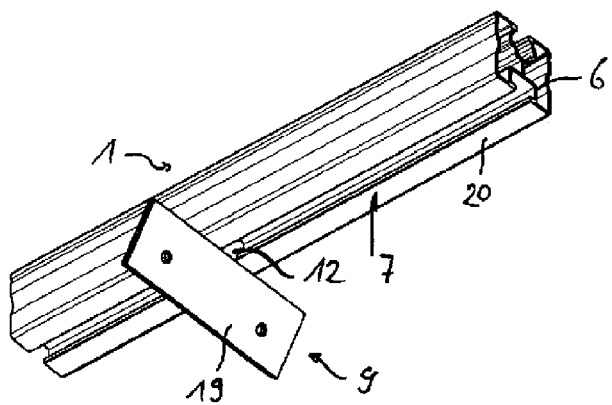
FIG. 5D shows a fourth step of joining the support rail to a retaining element according to FIG. 1.

FIG. 1, FIG. 3 and FIG. 4 show a fastening of a support rail 1 to two trapezoidal ribs 3, 4 of a trapezoidal sheet 5. The fastening corresponds to the dashed section D1 of the multi-arrangement according to FIG. 11. There, it is additionally illustrated that the support rail 1 is provided to carry a PV module 2.

Figure 11:
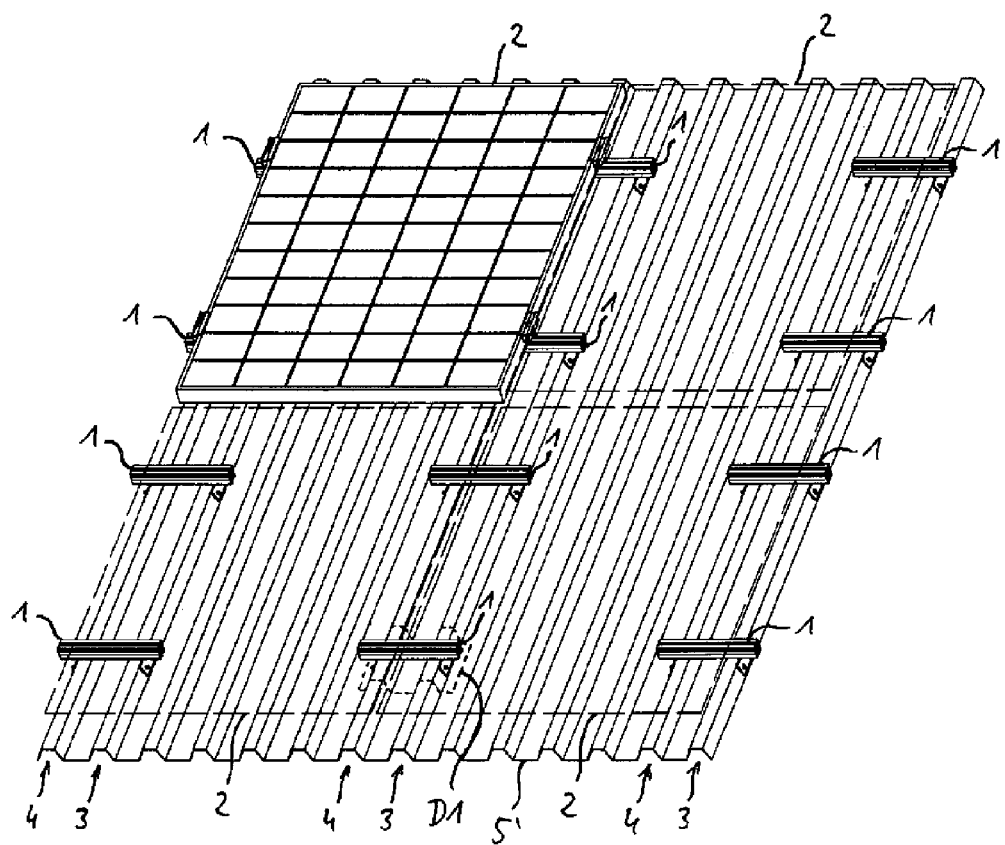
FIG. 11 shows a multi-arrangement with the detail according to FIG. 1.

The ribs 3, 4 are arranged at a distance and parallel to one another and have a cross section similar to a trapezoid, which is typical for trapezoidal sheets. It can also be seen that the support rail 1 is positioned at a right angle transverse to the ribs 3, 4 and also rests with its bottom side 20 directly on the upper sides 17, 18 of the ribs 3, 4. Alternatively, a thin elastic protection layer, upon which the support rail 1 rests in turn but does not itself act in a supporting manner, may be arranged directly on the upper sides 17, 18 of the ribs 3, 4. The support rail 1 can in any case transfer perpendicular loads on the upper sides 17, 18 of the ribs 3, 4. The support rail 1 is extruded and includes a groove 6, 23 undercut on both sides, both on the bottom side 20 as well on its upper side 21. The upper groove 23 is provided for clamping devices for the attachment of PV modules 2, as is shown in FIG. 11.

The fastening according to FIG. 1 further comprises two identical retaining elements 8, 9, which are fastened to the ribs 3, 4. For this purpose, each retaining element 8, 9 has a rectangular fastening section 10, 11, being flat and plate-shaped and forming the greatest part of the retaining elements 8, 9 and to which the retaining elements 8, 9 are each fastened to exactly one slanted side 15a, 16b of the ribs 3, 4. In a structurally advantageous manner, the slanted sides 15a, 16b are the outer two sides of the ribs 3, 4.

For the fastening, two self-cutting screws 24 are provided in each of the fastening sections 8, 9, wherein the threads of said screws are herein not illustrated in more detail. The screws 24 pass through prefabricated bores 25 in fastening sections 8, 9 and through the slanted sides 15a, 16b. The fastening sections 8, 9 are located below the level of the upper sides 17, 18. As can be seen in particular from FIG. 4, the fastening section 10 is designed in such a way that it protrudes along the slanted side 15a on both sides beside the support rail 1. An assembler can therefore actuate the screws 24 by means of a tool without being impeded by the support rail 1.

The fastening according to FIG. 1 is further characterized in that each of the retaining elements 8, 9 has an engaging extension 12 and 13, respectively, which is arranged non-detachably or irremovably on the respective fastening section 8, 9. The fastening section 10, 11 and the engaging extension 12, 13, respectively, are thus formed as a single-part metal sheet piece and are therefore integrally connected to each other. The engaging extensions 12, 13 protrude upwardly and centrally from the fastening sections 10, 11 so that the retaining elements 8, 9 are arranged centrally to the support rail 1 and rather mainly there below.

It can also be seen in FIG. 4 that the engaging extension 12 engages the groove 6 on either side in an engaging position. The engaging extension 12 therefore has two protrusions 26 directed opposite outwardly. The engaging position is directed transverse to the support rail 1 or parallel to the rib 3. In a loose position, which is rotated by 90° with respect to the engaging position, the retaining element 8 can be inserted with the engaging extension 12 through the groove opening 7 into the groove 6, which is illustrated in more detail in FIGS. 5A to 5D.

The support rail 1 is not only held down against the upper side 17 of the rib 3 by means of the engaging extension 8, but is clamped. In addition, the engaging extension 12 is designed with respect to the groove opening 7 in such a way that the support rail 1 is bidirectional fixed in its transverse direction. It is particularly characteristic that not only the fastening sections 10, 11, but the retaining elements 8, 9 as a whole as well, are arranged either just to the left or just to the right of the ribs 3, 4, that is to say are located either to the left or to the right of the center of the respective ribs 3, 4. The terms "left" and "right" are to be understood as transversely to the ribs 3, 4, as can be seen from FIG. 1, FIG. 3 and FIG. 11. As in this exemplary embodiment, the retaining elements 8, 9 are, for example, located as a whole laterally beside the respective slanted side 15a, 16b and do not contact the upper sides 17, 18, in contrast to the prior state of the art.

FIGS. 5A to 5D illustrate the joining of the retaining element 9 to the support rail 1 of the fastening according to FIG. 1 in an assembly sequence. The retaining element 9 is inserted through the groove opening 7 into the groove 6 with the engaging extension 12 at any point starting from an initial loose position A parallel to the support rail 1, such that the position B is reached. The retaining element 9 is then rotated by 90° into an engaging position C transversely to the support rail 1, where the engaging extension 12 engages the groove 6 to a maximum extent. Lastly, the retaining element 9 can be brought into a tilted position D corresponding approximately to the inclination of the slanted side. As the engaging extension 12 in this exemplary embodiment is significantly narrower than the groove opening 7 with respect to the loose position A, the retaining element 9 can be inserted into the groove 6 not only parallel, but also slightly diagonal to the support rail 1.

The joining process according to FIGS. 5A to 5D may take place before, or also after, the placement of the support rail 1 onto the ribs 3, 4. Should a longer support rail be provided, that crosses more than two ribs or into which more than two retaining elements are to be inserted, it may be expedient to place the support rail initially onto the ribs and only after this to insert the retaining elements into the groove from below. With reference to the arrangement according to FIG. 1 or FIG. 12, further retaining elements 8, 9 can thus advantageously be assembled subsequently on any free slanted side of the ribs, even if a support rail 1 or 1' has already been placed in position or has been fastened. The support rail 1 or 1' can thus be placed onto the ribs 3, 4 chronologically prior to the insertion of the retaining elements 8, 9, and the retaining elements 8, 9 can be inserted chronologically before the fastening of the fastening section 11 on the slanted sides 15b, 16b. These options make the fastening particularly assembly-friendly, versatile and fault-tolerant, in contrast to the prior state of the art.

Figures 6, 7:
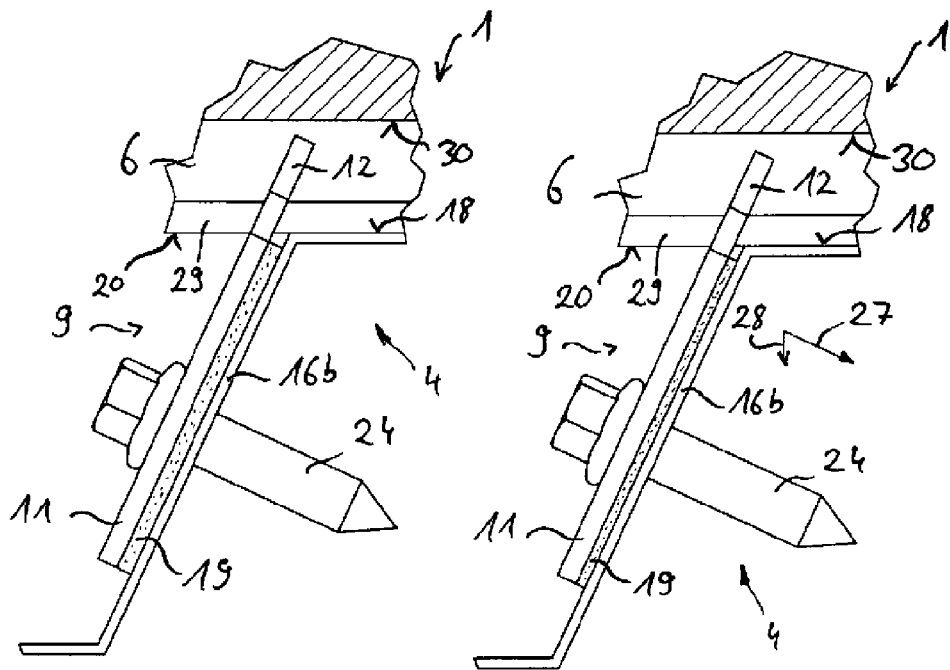
FIG. 6 shows a preassembled state of the retaining element according to FIG. 1.
FIG. 7 shows a final assembled state of the retaining element according to FIG. 1.

As in FIG. 3, left-hand side, FIGS. 6 and 7 also show in detail, however, that an elastic spacer 19 is arranged between the fastening section 11 of the retaining element 9 and the slanted side 16b of the rib 4. The elastic spacer is formed as a layer which spaces the fastening section 11 parallel from the slanted side 16b. The elastic spacer 19 is compressed when the screws 24 are actuated. In a final assembled position according to FIG. 7, the spacer 19 is thus narrower than in a preassembled state according to FIG. 6. The elastic spacer 19 can be rubber-like and may consist of an elastomer, such as EPDM or the like.

Due to this compression 27 of the spacer 26, the distance between the fastening element 11 and the slanted side 16b is reduced, whereby the retaining element 9 undergoes a hardly perceptible movement component 28 in a downward direction due to the inclination of the slanted side 16b. This effects that the retaining element 9 increasingly clamping the support rail 1 against the upper side 18 of the rib 4 by means of the engaging extension 12. The compression 27 and the movement component 28 are illustrated in FIG. 7 enlarged by a factor of approximately ten. As can be seen by the arrow 28, "downward" in this context means a direction downward, which is perpendicular to the upper side 18.

The spacer 26 acts simultaneously as a seal against rainwater, which could otherwise infiltrate the rib 4 through openings (not visible in more detail) in the slanted side 16b for the screws 24. To simplify assembly, the spacer 26 is already affixed to the fastening section 11 in a prefabricated manner, for example, by means of adhesive or double-sided adhesive tape. Alternatively or in addition, the spacer can be fastened by use of retaining nubs, which are impressed into the openings 25.

Figure 8:
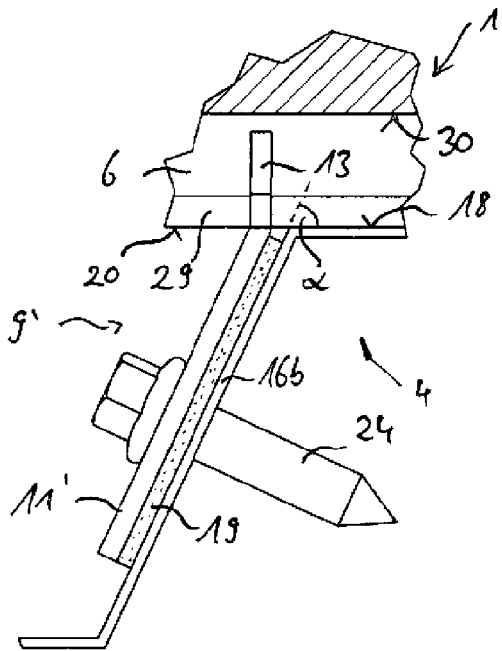
FIG. 8 shows a further retaining element in the preassembled state.

FIG. 8 shows a further exemplary embodiment of a retaining element 9', which has not yet been assembled in the final assembled state. The difference to the previously described retaining elements consists in that the engaging extension 13 thereof is formed at an angle to the fastening section 11' in such a way that the engaging extension 13 is steeper than the slanted side 16b of the rib 4. This means that an angle between the engaging extension 13 and the upper side 18 of the rib 4 is closer to a right angle than a corresponding angle α between a virtual straight extension of the slanted side 16b and the upper side 18 of the rib 4. In this exemplary embodiment, the engaging extension 13 is even perpendicular to the upper side 18 of the rib 4 and consequently engages behind the edges 29 of the groove 6.

Figure 9:
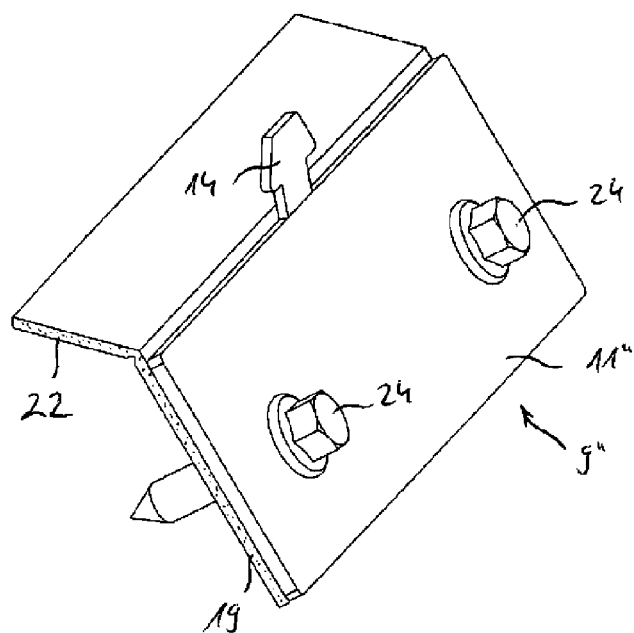
FIG. 9 shows, separately, a retaining element of the fastening.
Figure 10:
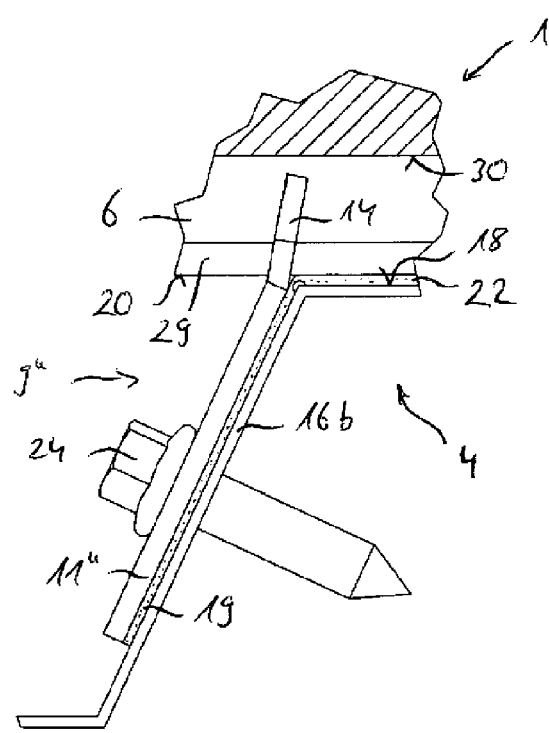
FIG. 10 shows a final assembled state with the retaining element according to FIG. 9.

FIG. 9 shows a further exemplary embodiment of a retaining element 9". A difference to the previously described retaining elements 9 and 9' lies in the fact that the elastic spacer 19 has an integral extension 22, which is intended to be arranged between the upper side 18 of the rib 4 and the bottom side 20 of the support rail 1. FIG. 10 thus shows the retaining means 9" in a final assembled state, in which the support rail 1 is clamped against the upper side 18 and the extension 22 is arranged therebetween. Upon the intended use, the extension 22 acts as a protective layer and protects the upper side 18 against abrasion and can additionally increase the frictional connection transverse to the rib 4. By providing the extension 22 on the spacer 19, it is possible to dispense with separate protection means, such as the prior application of a protective layer on the upper side 18 or on the bottom side 20. A further difference to the previous retaining elements 9 and 9' lies in the fact that the engaging extension 14 is formed at an angle of less than 90° to the upper side 18 but at an angle steeper than the slanted side 16b.

FIG. 11 shows a multi-arrangement with a total of 12 identical fastenings according to FIG. 1, wherein a common trapezoidal sheet area 5' with a multiplicity of trapezoidal ribs is provided. The trapezoidal sheet area 5' may consist of a single trapezoidal sheet, as illustrated, or may be composed of a plurality of such sheets. The support rails 1 are all positioned transversely to the ribs and in a pattern suitable for the attachment of rectangular PV modules 2. Four such PV modules 2, three of which are only illustrated schematically, are arranged on the support rails 1.

As the support rails 1 are to be as short as possible, but the spacing between the ribs and the format of the PV modules 2 usually are not adapted to each other, it is expedient if the support rails 1 cross two of the ribs, or possibly three if the spacings between the ribs are larger. In this exemplary embodiment it is sufficient for the support rails 1 to cross merely two ribs 3, 4. The support rails 1 therefore do not run continuously below the PV modules 2, but each end beneath the PV modules 2 in a material-saving manner. By the way, the dashed section D1 corresponds to the fastening according to FIG. 1.

For the application of the PV modules 2, the support rails 1 cross the edges of the PV modules 2 parallel to the ribs, wherein these edges are structurally advantageously the longitudinal edges of the PV modules 2. The PV modules 2 in each case rest to the left and right on two of the support rails 1 with these longitudinal edges. PV modules 2 adjacent in the transverse direction of the ribs in each case rest on two of the support rails 1 with their adjacent longitudinal edges and are attached thereto. As is shown with the PV module 2 in the top right-hand corner, the PV modules 2 can thus be clamped against the support rails 1 in the conventional manner. The adjacent longitudinal edges can, for example, be fastened jointly by means of "middle clamps", whereas "end clamps" can be used to fix the free edges individually.

Figure 12:
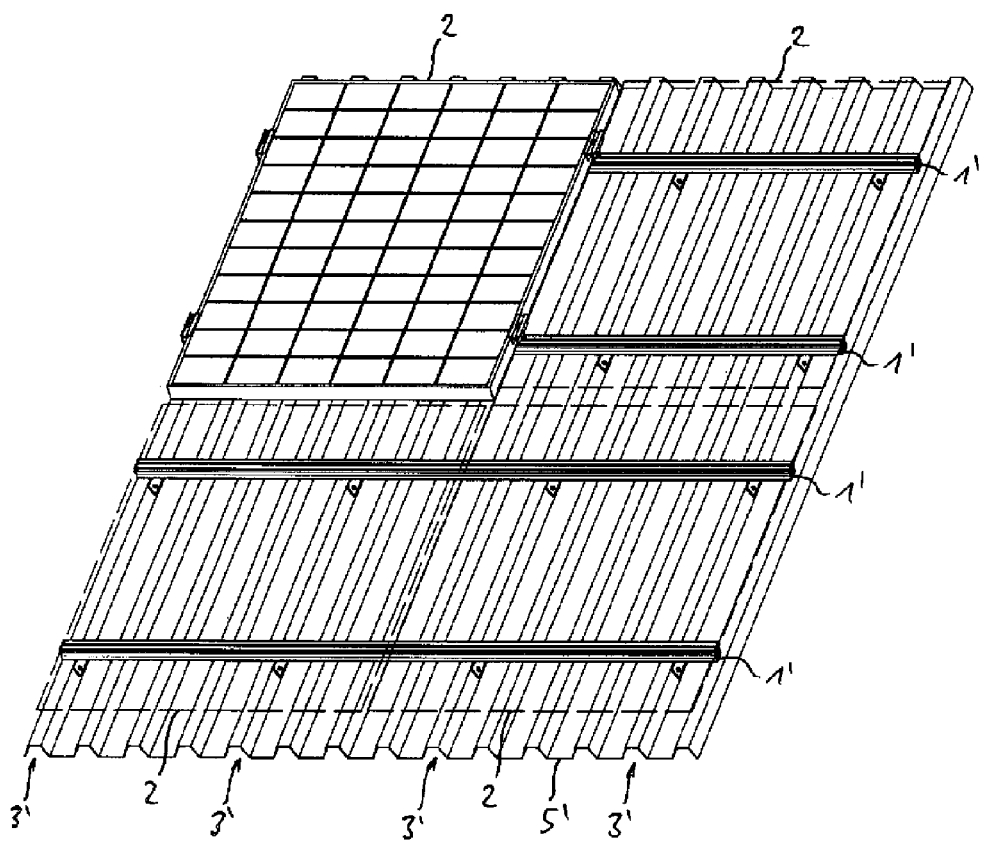
FIG. 12 shows a further multi-arrangement.

FIG. 12 lastly illustrates the fact that four long support rails 1' also carry the PV modules 2 conventionally in a row and, to this end, pass below the PV modules 2 and may cross an appropriately high number of ribs of the trapezoidal sheet area 5'. The support rails 1' are each clamped against the upper sides of the ribs 3' at regular distances by four retaining elements 8 according to FIG. 1.

The present invention is not limited to embodiments described herein; reference should be had to the appended claims.

What is claimed is:

1. A fastening of a support rail for a photovoltaic module to a trapezoidal rib of a trapezoidal sheet, wherein the support rail comprises an undercut groove with a groove opening arranged on a bottom side of the support rail, the trapezoidal rib comprises an upper side and a slanted side, and the support rail is configured to be positioned transversely to the trapezoidal rib, the fastening comprising:
at least one retaining element comprising:
a fastening section configured to be fastened to the slanted side of the trapezoidal rib, and
an engaging extension non-detachably arranged on the fastening section, the engaging extension being configured to engage the undercut groove in an engaging position,
wherein,
the engaging extension is configured to be insertable through the groove opening into the undercut groove of the support rail in a loose position that is rotated relative to the engaging position,
the bottom side of the support rail in the engaging position is in direct contact with and is held down against the upper side of the trapezoidal rib by the engaging extension, and
each of the at least one retaining element is arranged on a single slanted side of the trapezoidal rib.

2. The fastening as recited in claim 1, wherein the engaging extension comprises two protrusions arranged in opposing outward directions, the undercut groove is undercut on both sides, and the engaging extension is configured to engage the undercut groove on both sides via the two protrusions.

3. The fastening as recited in claim 1, wherein the engaging extension and the fastening section are at least one of integrally connected to each other and consist of a one-part unit from a piece comprising a sheet metal or a plastic.

4. The fastening as recited in claim 1, wherein the engaging extension and the fastening section are formed in a coplanar manner.

5. The fastening as recited in claim 1, wherein the engaging extension is formed at an angle to the fastening section so that the engaging extension is steeper than the slanted side of the trapezoidal rib.

6. The fastening as recited in claim 1, wherein the fastening section is configured to be fastened to the slanted side of the trapezoidal rib by screws or rivets.

7. The fastening as recited in claim 1, wherein the fastening section comprises at least one protrusion on the trapezoidal rib extending beyond a side of the support rail.

8. The fastening as recited in claim 1, further comprising a spacer comprising at least one of an elastic material and a plastic material, the spacer being arranged between the fastening section and the slanted side of the trapezoidal rib.

9. The fastening as recited in claim 8, wherein the spacer is fastened to the fastening section in a prefabricated manner.

10. The fastening as recited in claim 8, wherein the spacer comprises an extension arranged between the upper side of the trapezoidal rib and the support rail.

11. The fastening as recited in claim 1, wherein the trapezoidal sheet includes at least one additional trapezoidal rib comprising an upper side, the fastening further comprises at least one additional retaining element, the support rail crosses the trapezoidal rib and the at least one additional trapezoidal rib, and the at least one additional retaining element is configured to hold the support rail down against the upper side of the at least one additional trapezoidal rib.

12. The fastening as recited in claim 11, wherein the support rail crosses exactly two or three trapezoidal ribs, and exactly one additional retaining element is provided which is configured to hold the support rail down against the upper side of exactly one other of the two or three trapezoidal ribs.

13. The fastening as recited in claim 12, wherein the two or three trapezoidal ribs comprise two outer slanted sides, and the retaining elements are fastened to the two outer slanted sides.

14. The fastening as recited in claim 1, wherein the support rail comprises a second undercut groove configured to attach the photovoltaic module.

15. An arrangement comprising:
at least two support rails, each of the at least two support rails comprising at least two of the fastenings as recited in claim 1; and
a photovoltaic module;
wherein the photovoltaic module is attached to the at least two support rails comprising the at least two fastenings.

* * * * *